(12) United States Patent
Payer et al.

(10) Patent No.: US 6,317,062 B1
(45) Date of Patent: Nov. 13, 2001

(54) METHOD AND APPARATUS FOR DYNAMICALLY GENERATING MULTIPLE LEVEL DECISION THRESHOLDS OF AN M-ARY CODED SIGNAL

(75) Inventors: Daniel Payer, Orleans; Neil Birkett, Richmond, both of (CA)

(73) Assignee: Philsar Semiconductor, Inc., Nepean (CA)

( * ) Notice: Subject to any disclaimer, the term of this patent is extended or adjusted under 35 U.S.C. 154(b) by 0 days.

(21) Appl. No.: 09/676,235

(22) Filed: Sep. 29, 2000

(51) Int. Cl.[7] .................................................. H03M 5/02
(52) U.S. Cl. .......................... 341/56; 358/133; 355/14 E
(58) Field of Search ................................... 341/56, 57, 53, 341/51, 72, 94; 375/334; 340/648; 358/133, 282; 364/825, 715.02; 324/207.25; 355/14 E

(56) References Cited

U.S. PATENT DOCUMENTS

| | | | |
|---|---|---|---|
| 4,624,547 | * 11/1986 | Endo et al. ........................ | 355/14 E |
| 4,723,173 | * 2/1988 | Tanioka ............................. | 358/282 |
| 5,049,990 | * 9/1991 | Kondo et al. ..................... | 358/133 |
| 5,184,316 | * 2/1993 | Sugiyama ......................... | 364/715.02 |
| 5,210,712 | * 5/1993 | Saito ................................. | 364/825 |
| 5,732,110 | * 3/1998 | Richards .......................... | 375/334 |

OTHER PUBLICATIONS

Watkins–Johnson Company Tech–Notes–vol. 7, No. 5, Sep./Oct. 1980, pp. 2–15 FSK: Signals and Demodulation–WATSON, Bob.

* cited by examiner

*Primary Examiner*—Brian Young
*Assistant Examiner*—John Nguyen
(74) *Attorney, Agent, or Firm*—Thomas, Kayden, Horstemeyer & Risley, LLP

(57) ABSTRACT

A method and apparatus for dynamically generating multiple level decision thresholds of an M-ary demodulated signal for decoding the signal. The threshold values are obtained by obtaining the maximum and minimum peak values of the demodulated M-ary signal, averaging these peak values and subsequently processing these averaged values to establish the threshold for the particular M-ary signal. Infinite impulse response filters may be advantageously used in the averaging process and these filters may be preloaded with maximum and minimum peak values such that decision threshold levels may be generated immediately after receiving the M-ary demodulated signal.

22 Claims, 5 Drawing Sheets

METHOD AND APPARATUS FOR DYNAMICALLY GENERATING MULTIPLE LEVEL DECISION THRESHOLDS OF AN M-ARY CODED SIGNAL

FIELD OF THE INVENTION

The invention relates generally to radio architectures, and more particularly to the generation multiple level decision thresholds of an M-ary coded signal.

BACKGROUND OF THE INVENTION

In high power digital architectures, the demodulated received signal is often found to be a good representation of the binary or M-ary code that was originally transmitted given that channel perturbations are small with regard to signal parameters. Such a demodulated signal, as shown in FIG. 1, represents an ideal signal which has relatively constant minimum and maximum peaks about a relatively constant threshold level. Such a signal may easily be converted into ones and zeroes through the use of hard limiters.

However in low power radio architectures that are presently required in wireless applications, the transmitted signals have low amplitudes and/or low FSK/PSK deviations for low bandwidths; therefore when detected are found to experience degradations from noise and such as Rayleigh/Ricean fading where the maximum and minimum peaks are far from constant. In addition, the frequency offsets between the transmitter and receiver, and the dc offsets in the circuitry will change the mean value of the demodulation level. In the case where a fixed threshold is used to determine the bit values, it may occur that some minimum peaks are above the threshold or some maximum peaks are below the threshold resulting in bit errors. One solution used in such cases is to generate a dynamic threshold which is calculated to be midway between a sequential maximum and minimum as illustrated in FIG. 2. Though this type of solution has merit for the detection of binary signals, high bit error rates (BER) can still occur when detecting M-ary signals.

Therefore there is a need for quickly and dynamically generating decision thresholds that can effectively be used to decode signals having multiple levels.

SUMMARY OF THE INVENTION

The invention is directed to a method and apparatus for generating up to $2^m-1$ threshold levels where $m \geq 1$ for decoding a demodulated M-ary level signal. It comprises detecting a maximum peak and a minimum peak in the M-ary level signal during each of sequential periods P, continuously averaging the maximum peaks and the minimum peaks over a number n of the sequential periods, and processing the coincident averages of the maximum peaks and the minimum peaks to provide the up to $2^m-1$ threshold levels.

In accordance with another aspect of the invention, during at least a programmed number of sequential periods P', the $2^m-1$ threshold levels may initially be generated directly from the maximum peaks and the minimum peaks detected, and then be followed by $2^m-1$ threshold levels generated from the averages of the maximum peaks and the minimum peaks.

With regard to another aspect of this invention, the processor adds the averages of the maximum peaks with the coincident averages of the minimum peaks and divides the added averages by substantially two to provide a first decision threshold level. A second decision threshold level is produced by the processor by dividing the addition of the first threshold level and the averages of the maximum peaks by a factor $\beta$, while a third decision threshold level is produced by the processor by dividing the addition of the first threshold level and the averages of the minimum peaks by the factor $\beta$. The factor $\beta$ may be in the order of 2.

In accordance with yet another aspect of this invention, an M-ary level signal may be decoded by comparing the M-ary level signal to the $2^m-1$ threshold levels. The M-ary level signal may also first be delayed before comparing to compensate for processing delays in generating the threshold levels.

With regard to a further aspect of this invention, the averaging circuits may comprise infinite impulse response filters. Each filter may comprise an input and an output terminal, a first amplifier having an input coupled to the input terminal and an output, a summing circuit having a first input, a second input and an output with the first input coupled to the first amplifier output and the output coupled to the output terminal, and a feedback circuit coupled between the summing circuit output and the summing circuit second input. The infinite impulse response filter may further comprise a second amplifier having an input coupled to the input terminal and an output, and a switch which has a first position for connecting the second amplifier output to the feedback circuit and a second position for connecting the summing circuit output to the feedback circuit.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWINGS

The invention will be described with reference to the accompanying drawings, wherein.

DETAILED DESCRIPTION OF THE INVENTION

Figure 3:
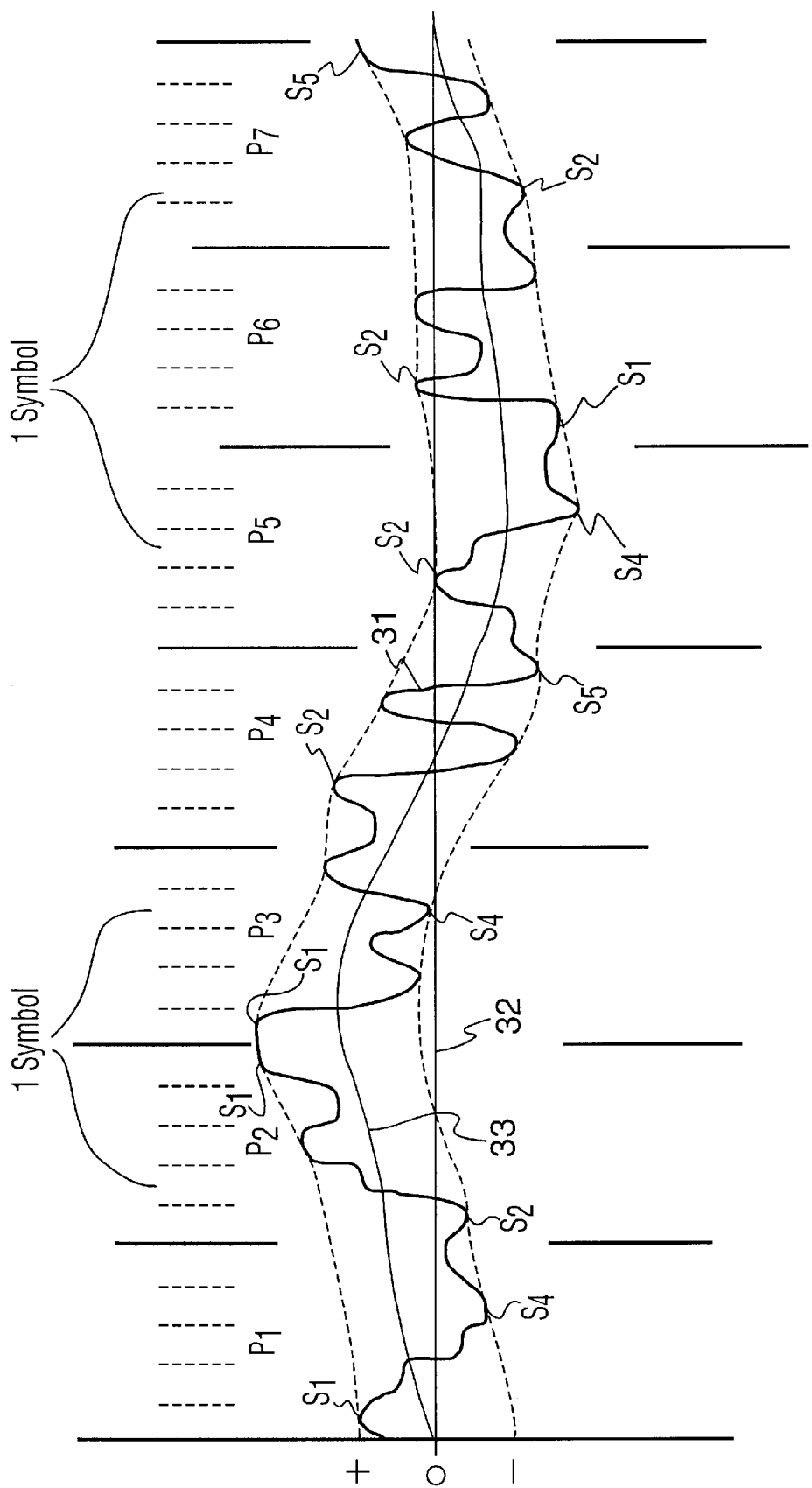
FIG. 3 illustrates a demodulated four level signal.

Though the present invention may be used to decode demodulated M-ary signals, for simplicity, the present invention will be described in conjunction with a demodulated four level signal 31, as illustrated in FIG. 3. FIG. 3 has been drawn for illustrative purposes only, signal 31 would not normally vary as quickly as shown, however these extreme amplitude variations do take place over longer periods of time. The transmitted signal that is being received and demodulated may have resulted from the phase or frequency shift keyed modulation of digital data. In FIG. 3, the demodulated signal 31 is seen to be experiencing substantial fading such that the signal maximum peaks are at times below a fixed threshold 32 and at other times the minimum peaks are above the fixed threshold 32. Thus if signal 31 was decoded using the fixed threshold 32 or a slowly varying threshold, a large BER would occur. In order to decode signal 31 in accordance with the present invention, a threshold 33 is established quickly, and dynamically generated from the received demodulated signal 31.

Figure 4:
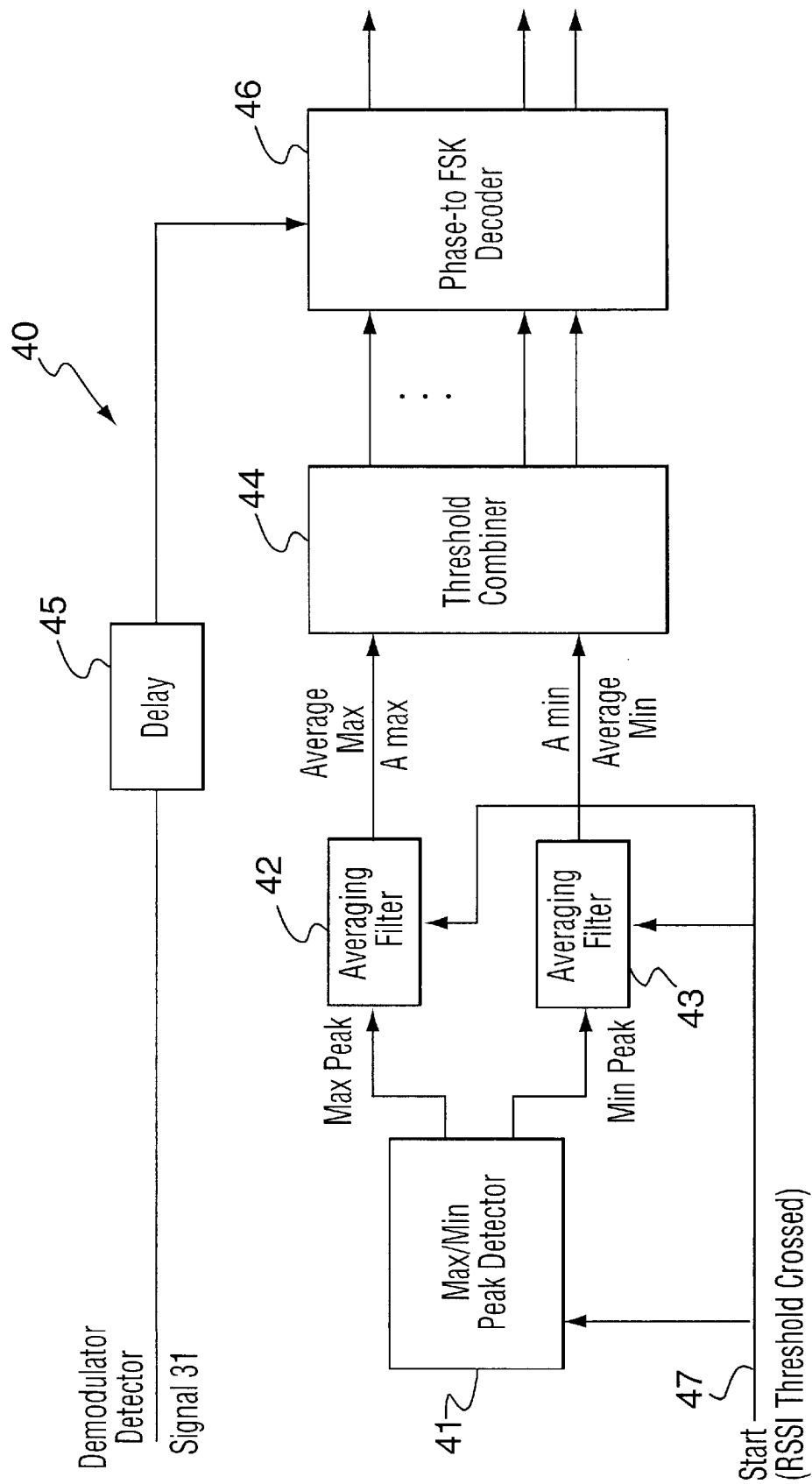
FIG. 4 illustrates the decision device in accordance with the present invention.

In accordance with the present invention, the signal 31 is applied to a decision device 40 illustrated in FIG. 4. The decision device 40 includes a maximum/minimun peak detector 41 which receives signal 31 and determines its maximum and minimum peak over a period of time P. Period P is programmable and selectable, and may also vary from application to application depending on parameters such as the bit rate. In FIG. 3, for regular operation the period P is shown to be equal to the duration of five symbols such that during period $P_1$, the maximum and minimum measured would be $s_1$ and $s_4$ respectively; during $P_2$–$s_5$ and $s_1$ respectively, during $P_3$–$s_1$ and $s_4$ respectively, during $P_4$–$s_2$ and $s_5$ respectively, and so on.

After each period P, the maximum peak sample detected during that period is fed to a first averaging filter 42, while the minimum peak sample detected during that period is fed to a second averaging filter 43, with both filters ultimately operating in parallel. The averaging filters 43 may be finite impulse response filters (FIR) or infinite impulse response filters (IIR). If FIR filters are used for averaging, filters 42 and 43 will produce an output signal representing the average maximum and average minimum respectively at the end of each period of time equivalent to nP based on n samples where n may be in the order of fifty (50). Alternately, if IIR filters are used for averaging, the filters provide a dynamic average wherein the average of n samples is taken after each new sample is received. This allows the filters 42 and 43 to update the averages after every period P.

Figure 5:
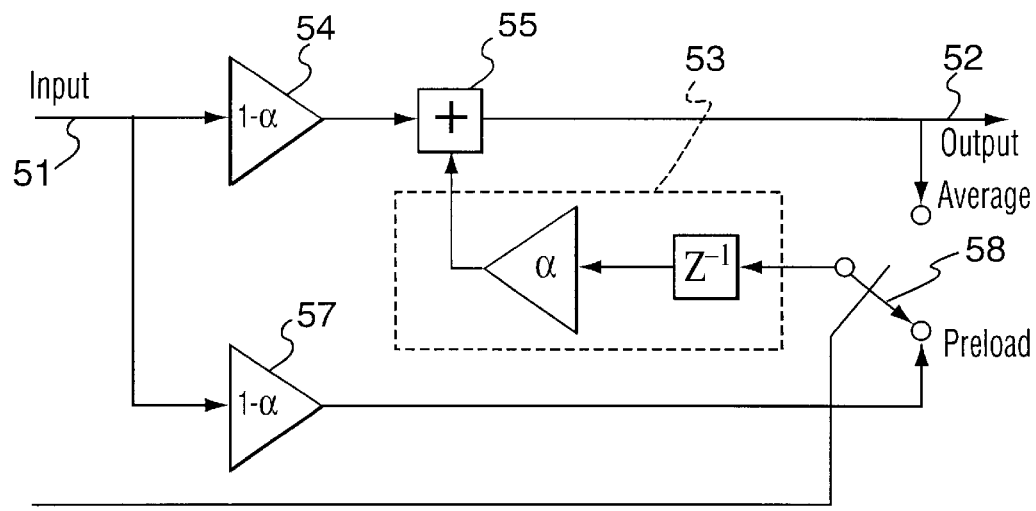
FIG. 5 illustrates an infinite impulse response filter used as an averaging filter in the preferred embodiment of this invention.

In the preferred embodiment, filters 42 and 43 are infinite impulse response (IIR) filters 50 of the type shown in FIG. 5. The characteristic of IIR filter 50 is, that in its averaging mode, it continuously provides at its output 52 the average of an infinite number of samples that it receives at its input 51. However, in filter 50 the input samples are weighted such that the latest sample carries the most weight and the weighting of each sample by age may decrease exponentially. This is accomplished by the feedback circuit 53 which applies a weighting factor $Z^{-1}$ and an amplification of α to the output signal before feeding it back to summing circuit 55. The input sample on line 51 is fed to an amplifier 54 which applies an amplification factor of (1−α) to the sample before it is fed to summing circuit 55. Thus once again the average at the output 52 is updated with every sample received at the input 51. Though an infinite number of samples theoretically enter into the determination of the average, in practice depending on factors α and $Z^{-1}$, and the precision used for computation, the latest fifty (50) or so samples actually affect the average.

Figure 1:
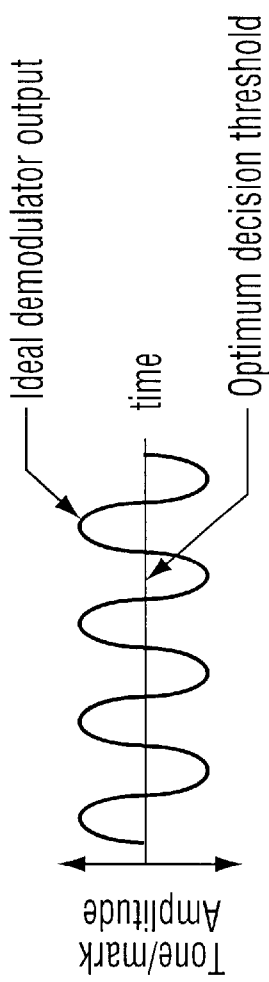
FIG. 1 illustrates an ideal demodulated FSK/PSK signal (binary case)
Figure 2:
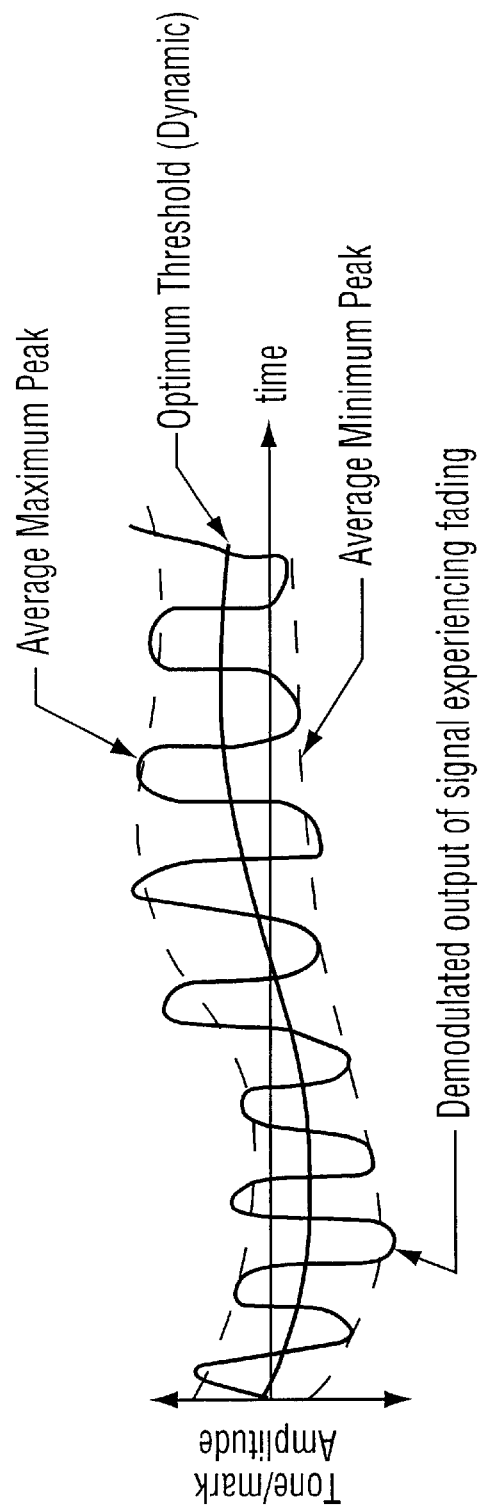
FIG. 2 illustrates a demodulated signal which is experiencing fading (binary case)
Figure 6:
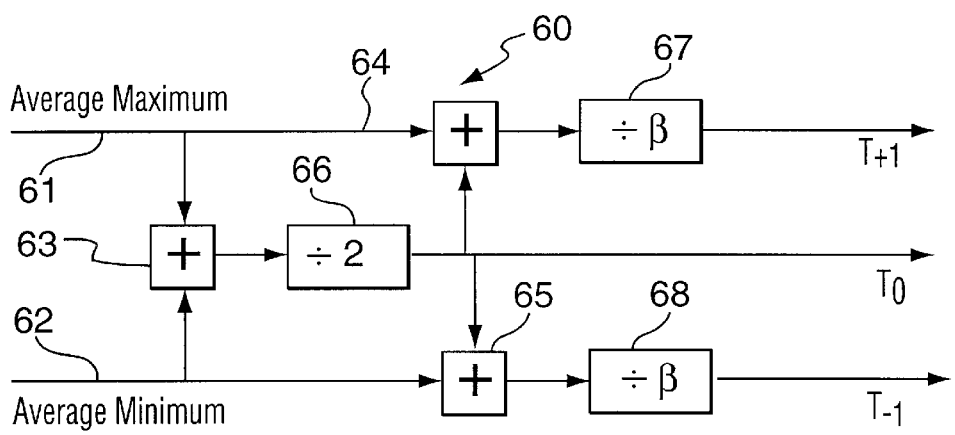
FIG. 6 illustrates a threshold combiner that may be used in the present invention.

Returning to FIG. 4, the average maximum signal $A_{max}$ and the average minimum signal $A_{min}$ are fed to a threshold combiner 44 where threshold levels are determined. One example of a threshold combiner 44 is illustrated in FIG. 6 as combiner 60. Signals $A_{max}$ and $A_{min}$ are applied to lines 61 and 62 respectively. Line 61 is connected to a first summing circuit 63 and a second summing circuit 64, while line 62 is connected to the first summing circuit 63 and a third summing circuit 65. The output of the first summing circuit 63 is connected to a divide by 2 divider 66 to provide an output threshold signal $T_o$ which is midway between $A_{max}$ and $A_{min}$ at that instant in time. Threshold signal $T_o$ may then be used to decode binary demodulated signals such as the one illustrated in FIG. 2. In an FSK demodulator, $T_o$ represents the mid or carrier frequency of the FSK frequencies $f_{+1}$ and $f_{-1}$.

$T_o$ is also applied to summing circuits 64 and 65 which produce outputs equal to $A_{max}+T_o$ and $A_{min}+T_o$ respectively. These outputs are applied to divide by β dividers 67 and 68 in order to produce two further threshold signals $T_{+1}$ and $T_{-1}$ respectively. Depending on the factor β, $T_{+1}$ will be somewhere between $T_o$ and $A_{max}$ and $T_{-1}$ will be somewhere between $T_o$ and $A_{min}$. With factor β=2, $T_{+1}$ and $T_{-1}$ will be midway between $T_o$ and $A_{max}$ and $T_{-1}$ will be midway between $T_o$ and $A_{min}$. Using the three threshold levels $T_{+1}$, $T_o$ and $T_{-1}$, four level demodulated signals such as illustrated in FIG. 3 may be efficiently decoded as will be described. However, in addition, the three threshold levels $T_{+1}$, $T_o$ and $T_{-1}$ may further be used in the same manner as above to produce further threshold levels $T_{+m}$ and $T_{-m}$ if they are required to decode signals having $2^m$ levels where m≧3.

In order to decode the demodulated signal 31 received from the demodulator/detector as illustrated in FIG. 4, the signal 31 is applied to a delay circuit 45 which provides a small delay to the signal to make up for the inherent delays produced by signal processing in the averaging filters 42 and 43 as well as in the threshold combiner 44, but more importantly by the delay created in the peak detector 41 which selects a maximum peak and a minimum peak during a period P. To compensate for the peak detector 41 delay, a delay of P would be required in the delay circuit 45. The delayed signal 31 is then applied to decoder 46 where it is compared to the threshold levels $T_{+1}$, $T_o$ and $T_{-1}$ to determine the actual output level of the signal 31.

Figure 7:
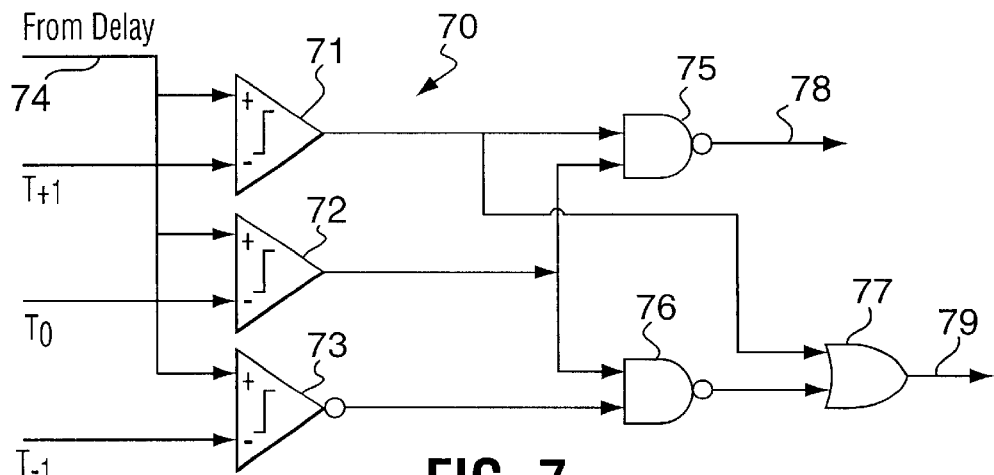
FIG. 7 illustrates a decoder that may be used with the present invention.

One example of the decoder 46 is shown as decoder 70 in FIG. 7. Decoder 70 includes three comparators 71, 72 and 73. The delayed demodulated four level signal 31 is applied to line 74 which is connected to the positive input of each of the comparators 71, 72 and 73. $T_{+1}$ is applied to the negative input of comparator 71, $T_o$ is applied to the negative input of comparator 72 and $T_{-1}$ is applied to the negative input of comparator 73. The outputs of comparators 71 and 72 are applied to the two inputs of a NAND gate 75 and the outputs of comparators 72 and 73 are applied to the inputs of NAND gate 76. In addition, the output of comparator 71 is applied to one input of an OR-gate 77 with the output of NAND-gate 76 applied to the other input of OR-gate 77. The resulting outputs on lines 78 and 79 from NAND-gate 75 and OR-gate 77 respectively represent the signal 31 magnitude value for the four level FSK case.

In comparators 71, 72 and 73, when the input signal 31 is greater than the threshold value applied to a comparator, the comparator generates a "1" and when the input signal is smaller than the threshold value applied to a comparator, the comparator generates a "0". Therefore, when signal 31≧$T_{+1}$, the outputs of 71, 72 and 73 are all "1"; when signal 31<$T_{+1}$ but >$T_o$, the output of 71 is "0" and the outputs of 72 and 73 are "1"; when signal 31<$T_o$ but >$T_{-+1}$, the outputs of 71 and 72 are "0" and the output of 73 is "1"; and when signal 31<$T_{-1}$ the outputs of 71, 72 and 73 are "0". As a result, the lines 78 and 79 will provide the following parallel binary code for the four level signal:

|  | line 78 | line 79 |
|---|---|---|
| signal 31 > $T_{+1}$ | 0 | 1 |
| $T_{+1}$ > signal 31 > $T_0$ | 0 | 0 |
| $T_0$ > signal 31 > $T_{-1}$ | 1 | 0 |
| signal 31 < $T_{-1}$ | 1 | 1 |

Though the above coding was arbitrarily selected different coding may be selected if desired, then only the combinatorial logic following the comparators will change. As the number of levels in the signal 31 increases, the number of parallel binary codes will also increase. Thus a signal 31 with $2^m$ levels will result in m parallel binary bits at the output of decoder 46.

Figure 8:
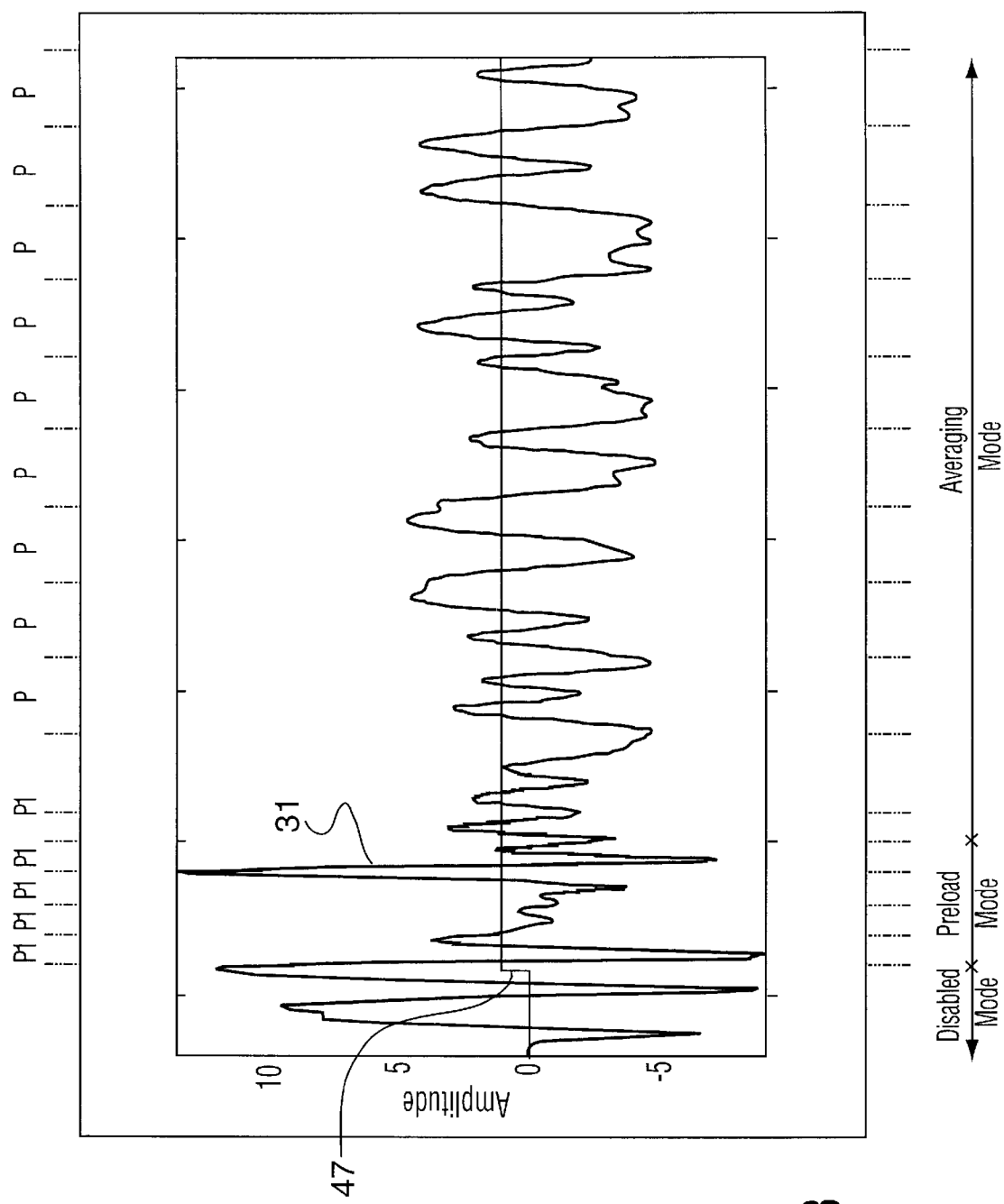
FIG. 8 illustrates the M-ary signal with P' periods identified for preload mode and P periods for averaging mode operation.

Referring to FIG. 4, the decision device 40 is activated when the peak detector 41 receives a signal 47 from the received signal strength indicator (RSSI) in the radio receiver which normally indicates that the incoming signal is present. This step signal 47 is also shown in FIG. 8. In order not to lose the data in the first part of an incoming signal, it is desirable to preload the averaging filters 50 using maximum and minimum sample values since the average maximum and average minimum values that can be used by the threshold combiner 44 are not initially available. As shown in FIG. 5, this is achieved by including a bypass line 56, an amplifier 57 with an amplification factor of 1/α and a switch 58 in each of the averaging filters 50 such that, when the switch 58 is positioned in the preload mode, a maximum/minimum sample value is applied to the summing circuit 55 and out onto line 52 to the combiner 44 to generate threshold values.

As illustrated in FIG. 8, after the RSSI signal 47 goes high, the preload mode is initiated and the peak detector 41 is controlled to output maximum and minimum sample values at the end of each preload period P', where the preload period P' is shorter than the averaging period and is equal to the length of two symbols. In the averaging mode, the peak detector 41 is controlled to output a maximum peak sample and a minimum peak sample at the end of each period P, where P is equal to the length of 5 symbols. It is noted that initially signal 31 is somewhat erratic with substantial swings between maxima and minima, however the preloading of filters 50 is programmed to be repeated for a number of periods P' with the result that the maximum sample value and the minimum sample value being fed to the combiner 44 will result in the generation of acceptable threshold levels to decode the initial data in signal 31 after which time switch 58 is switched to the averaging mode such that the output of summing circuit 55 is fed back to the summing circuit 55 through feedback circuit 53. There is a smooth transition between the preload mode and the averaging mode, since the averaging circuit 50 uses the last preload sample value on which to apply the averaging process.

Though for convenience, the present invention was described using digital circuitry, analog circuitry may also be used in its implementation.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. A method of generating up to $2^m-1$ threshold levels for decoding a demodulated M-ary level signal where m ≥ 1 comprising the steps of:
   a. detecting a maximum peak in the M-ary level signal during each of sequential periods P;
   b. detecting a minimum peak in the M-ary level signal during each of the sequential periods P;
   c. continuously averaging the maximum peaks over a number n of the sequential periods P;
   d. continuously averaging the minimum peaks over the number n of the sequential periods P;
   e. processing the averages of the maximum peaks and the averages of the minimum peaks to provide up to $2^m-1$ threshold levels.

2. A method as claimed in claim 1 wherein step (e) includes:
   i. processing the maximum peaks and the minimum peaks detected during corresponding sequential periods to provide up to $2^m-1$ threshold levels during at least an initial programmed number of sequential periods P'; and
   ii. processing the averages of the maximum peaks and the averages of the minimum peaks to provide up to $2^m-1$ threshold levels after the number of sequential periods P'.

3. A method as claimed in claim 1 wherein step (e) includes:
   i. adding the averages of the maximum peaks with the averages of the minimum peaks;
   ii. dividing the added averages by substantially two to provide a first decision threshold level;
   iii. adding the first threshold level and the averages of the maximum peaks;
   iv. simultaneously adding the first threshold level and the averages of the minimum peaks;
   v. dividing the resultant value of step (iii) by a factor β to provide a second decision threshold level; and
   vi. dividing the resultant value of step (iv) by the factor β to provide a third decision threshold level.

4. A method as claimed in claim 3 wherein β=2.

5. A method of decoding a demodulated M-ary level signal where m≥1 comprising the steps:
   a. detecting a maximum peak in the M-ary level signal during each of sequential periods P;
   b. detecting a minimum peak in the M-ary level signal during each of the sequential periods P;
   c. continuously averaging the maximum peaks over a number n of the sequential periods P;
   d. continuously averaging the minimum peaks over the number n of the sequential periods P;
   e. processing the averages of the maximum peaks and the averages of the minimum peaks to provide up to $2^m-1$ threshold levels.
   f. comparing the M-ary level signal to the $2^m-1$ threshold levels to decode the M-ary level signal.

6. A method as claimed in claim 5 wherein step (f) includes delaying the M-ary level signal before comparing.

7. A method as claimed in claim 5 wherein step (e) includes:
   i. adding the averages of the maximum peaks with the averages of the minimum peaks;

ii. dividing the added averages by substantially two to provide a first decision threshold level;

iii. adding the first threshold level and the averages of the maximum peaks;

iv. simultaneously adding the first threshold level and the averages of the minimum peaks;

v. dividing the resultant value of step (iii) by a factor $\beta$ to provide a second decision threshold level; and vi. dividing the resultant value of step (iv) by the factor $\beta$ to provide a third decision threshold level.

8. A method as claimed in claim 7 wherein $\beta=2$.

9. Apparatus for generating up to $2^m-1$ threshold levels for decoding a demodulated M-ary level signal where $m \geq 1$ comprising:

a. means for detecting a maximum peak in the M-ary level signal during each of sequential periods P;

b. means for detecting a minimum peak in the M-ary level signal during each of the sequential periods P;

c. means for continuously averaging the maximum peaks over a number n of the sequential periods P;

d. means for continuously averaging the minimum peaks over the number n of the sequential periods P; and e. means for processing the averages of the maximum peaks and the averages of the minimum peaks to provide up to $2^m-1$ threshold levels.

10. Apparatus as claimed in claim 9 wherein the means for averaging the maximum peaks and the means for averaging minimum peaks comprise infinite impulse response filters.

11. Apparatus as claimed in claim 10 wherein each infinite impulse response filter comprises:

i. input means and output means;

ii. first amplifier means having an input coupled to the input means, and an output;

iii. summing circuit means having a first input, a second input and an output, the first input being coupled to the first amplifier output and the output being coupled to the output means; and iv. feedback circuit means coupled between the summing circuit output and the summing circuit second input.

12. Apparatus as claimed in claim 11 wherein the infinite impulse response filter further comprises:

i. second amplifier means having an input coupled to the input means, and an output; and ii. switch means coupled to the feedback means and having a first position for connecting the second amplifier output to the feedback circuit means and a second position for connecting the summing circuit output to the feedback circuit means.

13. Apparatus as claimed in claim 9 wherein the processing means comprises:

i. first summing means for adding the averages of the maximum peaks to the averages of the minimum peaks;

ii. first divider means for dividing the first summed value to provide a first threshold level;

iii. second summing means for adding the averages of the maximum peaks to the first threshold level;

iv. second divider means for dividing the second summed value by a factor $\beta$ to provide a second threshold level;

v. third summing means for adding the averages of the minimum peaks to the first threshold level; and vi. third divider means for dividing the third summed value by a factor $\beta$ to provide a third threshold level.

14. Apparatus as claimed in claim 13 wherein the first divider means is a divide by two divider.

15. Apparatus as claimed in claim 13 wherein the factor $\beta$ is substantially equal to two.

16. Apparatus for decoding a demodulated M-ary level signal where $m \geq 1$ comprising the steps:

a. means for detecting a maximum peak in the M-ary level signal during each of sequential periods P;

b. means for detecting a minimum peak in the M-ary level signal during each of the sequential periods P;

c. means for continuously averaging the maximum peaks over a number n of the sequential periods P;

d. means for continuously averaging the minimum peaks over the number n of the sequential periods P;

e. means for processing the averages of the maximum peaks and the coincident averages of the minimum peaks to provide up to $2^m-1$ threshold levels.

f. means for comparing the M-ary level signal to the $2^m-1$ threshold levels to decode the M-ary level signal.

17. Apparatus as claimed in claim 16 wherein the means for averaging the maximum peaks and the means for averaging minimum peaks comprise infinite impulse response filters.

18. Apparatus as claimed in claim 17 wherein each infinite impulse response filter comprises:

i. input means and output means;

ii. first amplifier means having an input coupled to the input means, and an output;

iii. summing circuit means having a first input, a second input and an output, the first input being coupled to the first amplifier output and the output being coupled to the output means; and iv. feedback circuit means coupled between the summing circuit output and the summing circuit second input.

19. Apparatus as claimed in claim 18 wherein the infinite impulse response filter further comprises:

i. second amplifier means having an input coupled to the input means, and an output; and ii. switch means coupled to the feedback means and having a first position for connecting the second amplifier output to the feedback circuit means and a second position for connecting the summing circuit output to the feedback circuit means.

20. Apparatus as claimed in claim 16 wherein the processing means comprises:

i. first summing means for adding the averages of the maximum peaks to the averages of the minimum peaks;

ii. first divider means for dividing the first summed value to provide a first threshold level;

iii. second summing means for adding the averages of the maximum peaks to the first threshold level;

iv. second divider means for dividing the second summed value by a factor $\beta$ to provide a second threshold level;

v. third summing means for adding the averages of the minimum peaks to the first threshold level; and vi. third divider means for dividing the third summed value by a factor $\beta$ to provide a third threshold level.

21. Apparatus as claimed in claim 20 wherein the first divider means is a divide by two divider.

22. Apparatus as claimed in claim 20 wherein the factor $\beta$ is substantially equal to two.

* * * * *